(12) United States Patent
Wang et al.

(10) Patent No.: US 7,498,225 B1
(45) Date of Patent: Mar. 3, 2009

(54) SYSTEMS AND METHODS FOR FORMING MULTIPLE FIN STRUCTURES USING METAL-INDUCED-CRYSTALLIZATION

(75) Inventors: Haihong Wang, Milpitas, CA (US);
Shibly S. Ahmed, San Jose, CA (US);
Ming-Ren Lin, Cupertino, CA (US);
Bin Yu, Cupertino, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 132 days.

(21) Appl. No.: 11/428,722

(22) Filed: Jul. 5, 2006

Related U.S. Application Data (62) Division of application No. 10/726,569, filed on Dec. 4, 2003, now abandoned.

(51) Int. Cl.
*H01L 21/336* (2006.01)
*H01L 21/3205* (2006.01)
*H01L 21/4763* (2006.01)

(52) U.S. Cl. .............. 438/283; 438/588; 257/E21.454; 257/E21.345

(58) Field of Classification Search ................ 438/151, 438/157, 283, 588; 257/E21.404, E21.454, 257/E21.455, E21.345, E21.442
See application file for complete search history.

(56) References Cited

U.S. PATENT DOCUMENTS

| | | |
|---|---|---|
| 4,996,574 A | 2/1991 | Shirasaki |
| 5,115,289 A | 5/1992 | Hisamoto et al. |
| 5,338,959 A | 8/1994 | Kim et al. |
| 5,545,586 A | 8/1996 | Koh |
| 5,705,414 A | 1/1998 | Lustig |
| 5,932,911 A | 8/1999 | Yue et al. |
| 6,063,688 A | 5/2000 | Doyle et al. |
| 6,177,299 B1 | 1/2001 | Hsu et al. |
| 6,180,441 B1 | 1/2001 | Yue et al. |
| 6,232,622 B1 | 5/2001 | Hamada |

(Continued)

FOREIGN PATENT DOCUMENTS

DE 196 33 914 C1 8/1997

(Continued)

OTHER PUBLICATIONS

Digh Hisamoto et al., "FinFET-A Self-Aligned Double-Gate MOSFET Scalable to 20 nm," IEEE Transactions on Electron Devices, vol. 47, No. 12, Dec. 2000, pp. 2320-2325.

(Continued)

*Primary Examiner*—Walter L Lindsay, Jr.
(74) *Attorney, Agent, or Firm*—Harrity & Harrity, LLP (57) ABSTRACT

A method for forming fin structures for a semiconductor device that includes a substrate and a dielectric layer formed on the substrate is provided. The method includes etching the dielectric layer to form a first structure, depositing an amorphous silicon layer over the first structure, and etching the amorphous silicon layer to form second and third fin structures adjacent first and second side surfaces of the first structure. The second and third fin structures may include amorphous silicon material. The method further includes depositing a metal layer on upper surfaces of the second and third fin structures, performing a metal-induced crystallization operation to convert the amorphous silicon material of the second and third fin structures to a crystalline silicon material, and removing the first structure.

20 Claims, 10 Drawing Sheets

U.S. PATENT DOCUMENTS

| | | |
|---|---|---|
| 6,358,827 B1 | 3/2002 | Chen et al. |
| 6,413,802 B1 | 7/2002 | Hu et al. |
| 6,475,869 B1 | 11/2002 | Yu |
| 6,492,212 B1 | 12/2002 | Leong et al. |
| 6,514,819 B1 | 2/2003 | Choi |
| 6,525,403 B2 | 2/2003 | Inaba et al. |
| 6,537,880 B1 | 3/2003 | Tseng |
| 6,562,665 B1 | 5/2003 | Yu |
| 6,583,469 B1 | 6/2003 | Fried et al. |
| 6,645,797 B1 | 11/2003 | Buynoski et al. |
| 6,657,259 B2 | 12/2003 | Fried et al. |
| 6,689,650 B2 | 2/2004 | Gambino et al. |
| 6,696,713 B2 | 2/2004 | Ishibashi |
| 6,716,686 B1 | 4/2004 | Buynoski et al. |
| 6,762,448 B1 * | 7/2004 | Lin et al. .............. 257/302 |
| 6,770,516 B2 | 8/2004 | Wu et al. |
| 6,794,718 B2 | 9/2004 | Nowak et al. |
| 2001/0005022 A1 | 6/2001 | Ogura |
| 2002/0011612 A1 | 1/2002 | Hieda |
| 2002/0043690 A1 | 4/2002 | Doyle et al. |
| 2002/0060338 A1 | 5/2002 | Zhang |
| 2002/0153587 A1 | 10/2002 | Adkisson et al. |
| 2003/0178677 A1 | 9/2003 | Clark et al. |
| 2004/0036126 A1 | 2/2004 | Chau et al. |
| 2004/0099885 A1 | 5/2004 | Yeo et al. |
| 2004/0108545 A1 | 6/2004 | Ando |
| 2005/0020020 A1 | 1/2005 | Collaert et al. |
| 2005/0073060 A1 | 4/2005 | Datta et al. |

FOREIGN PATENT DOCUMENTS

| | | |
|---|---|---|
| EP | 1 202 335 A2 | 5/2002 |
| EP | 1 383 164 A1 | 1/2004 |
| JP | 04192564 A | 7/1992 |

OTHER PUBLICATIONS

Yang-Kyu Choi et al., "Sub-20nm CMOS FinFET Technologies," 2001 IEEE, IEDM, pp. 421-424.

Xuejue Huang et al., "Sub-50 nm P-Channel FinFET," IEEE Transactions on Electron Devices, vol. 48, No. 5, May 2001, pp. 880-886.

Xuejue Huang et al., "Sub 50-nm FinFET: PMOS," 1999 IEEE, IEDM, pp. 67-70.

Yang-Kyu Choi et al., "Nanoscale CMOS Spacer FinFET for the Terabit Era," IEEE Electron Device Letters, vol. 23, No. 1, Jan. 2002, pp. 25-27.

U.S. Appl. No. 10/754,515, filed Jan. 12, 2004, entitled: "FinFET Device With Multiple Fin Structures"; 20 pages.

U.S. Appl. No. 10/755,344, filed Jan. 13, 2004, entitled: "FinFET Device With Multiple Channels"; 24 pages.

* cited by examiner

SYSTEMS AND METHODS FOR FORMING MULTIPLE FIN STRUCTURES USING METAL-INDUCED-CRYSTALLIZATION

RELATED APPLICATION

This application is a divisional of U.S. patent application Ser. No. 10/726,569, filed Dec. 4, 2003, the disclosure of which is incorporated by reference herein.

FIELD OF THE INVENTION

The present invention relates generally to semiconductor manufacturing and, more particularly, to FinFET devices that include multiple silicon fin structures and a method for forming the fin structures.

BACKGROUND OF THE INVENTION

Scaling of device dimensions has been a primary factor driving improvements in integrated circuit performance and reduction in integrated circuit cost. Due to limitations associated with gate-oxide thicknesses and source/drain (S/D) junction depths, scaling of existing bulk MOSFET devices below the 0.1 µm process generation may be difficult, if not impossible. New device structures and new materials, thus, are likely to be needed to improve FET performance.

Double-gate MOSFETs represent devices that are candidates for succeeding existing planar MOSFETs. In double-gate MOSFETs, the use of two gates to control the channel significantly suppresses short-channel effects. A FinFET is a double-gate structure that includes a channel formed in a vertical fin. Although a double-gate structure, the FinFET is similar to existing planar MOSFETs in layout and fabrication techniques. The FinFET also provides a range of channel lengths, CMOS compatibility, and large packing density compared to other double-gate structures.

SUMMARY OF THE INVENTION

Implementations consistent with the principles of the invention provide multiple silicon fin structures formed on a semiconductor device. The multiple fin structures may, in implementations consistent with the principles of the invention, have a very small pitch.

In accordance with the purpose of this invention as embodied and broadly described herein, a method facilitates the forming of fin structures for a semiconductor device that includes a substrate and a dielectric layer formed on the substrate. The method includes etching the dielectric layer to form a first structure, depositing an amorphous silicon layer over the first structure, and etching the amorphous silicon layer to form second and third fin structures adjacent first and second side surfaces of the first structure. The second and third fin structures may include amorphous silicon material. The method further includes depositing a metal layer on upper surfaces of the second and third fin structures, performing a metal-induced crystallization operation to convert the amorphous silicon material of the second and third fin structures to a crystalline silicon material, and removing the first structure.

According to another aspect of the invention, a method of forming fin structures for a semiconductor device is provided. The method may include forming multiple fin structures from amorphous silicon and forming a metal layer on a surface of each of the multiple fin structures. The method may further include annealing the metal layer to convert the amorphous silicon to crystalline silicon to produce multiple crystalline fin structures.

According to yet another aspect of the invention, a method is provided. The method may include forming a fin structure from amorphous semiconducting material. The method may further include performing a metal-induced-crystallization operation upon the fin structure to convert the amorphous semiconducting material to crystalline semiconducting material.

BRIEF DESCRIPTION OF THE DRAWINGS

The accompanying drawings, which are incorporated in and constitute a part of this specification, illustrate an embodiment of the invention and, together with the description, explain the invention. In the drawings.

DETAILED DESCRIPTION

The following detailed description of implementations consistent with the present invention refers to the accompanying drawings. The same reference numbers in different drawings may identify the same or similar elements. Also, the following detailed description does not limit the invention. Instead, the scope of the invention is defined by the appended claims and their equivalents.

Implementations consistent with the principles of the invention provide crystalline silicon fin structures that are formed on a semiconductor device. FinFET channel width is defined by the height of the fin. The fin height is typically limited due to patterning concerns, affecting the drive current. Implementations consistent with the principles of the invention use multiple fin structures in order to achieve the desired drive current. For area efficiency, the multiple fin structures may be densely provided (i.e., formed in close proximity to each other).

Exemplary Processing

Figure 1:
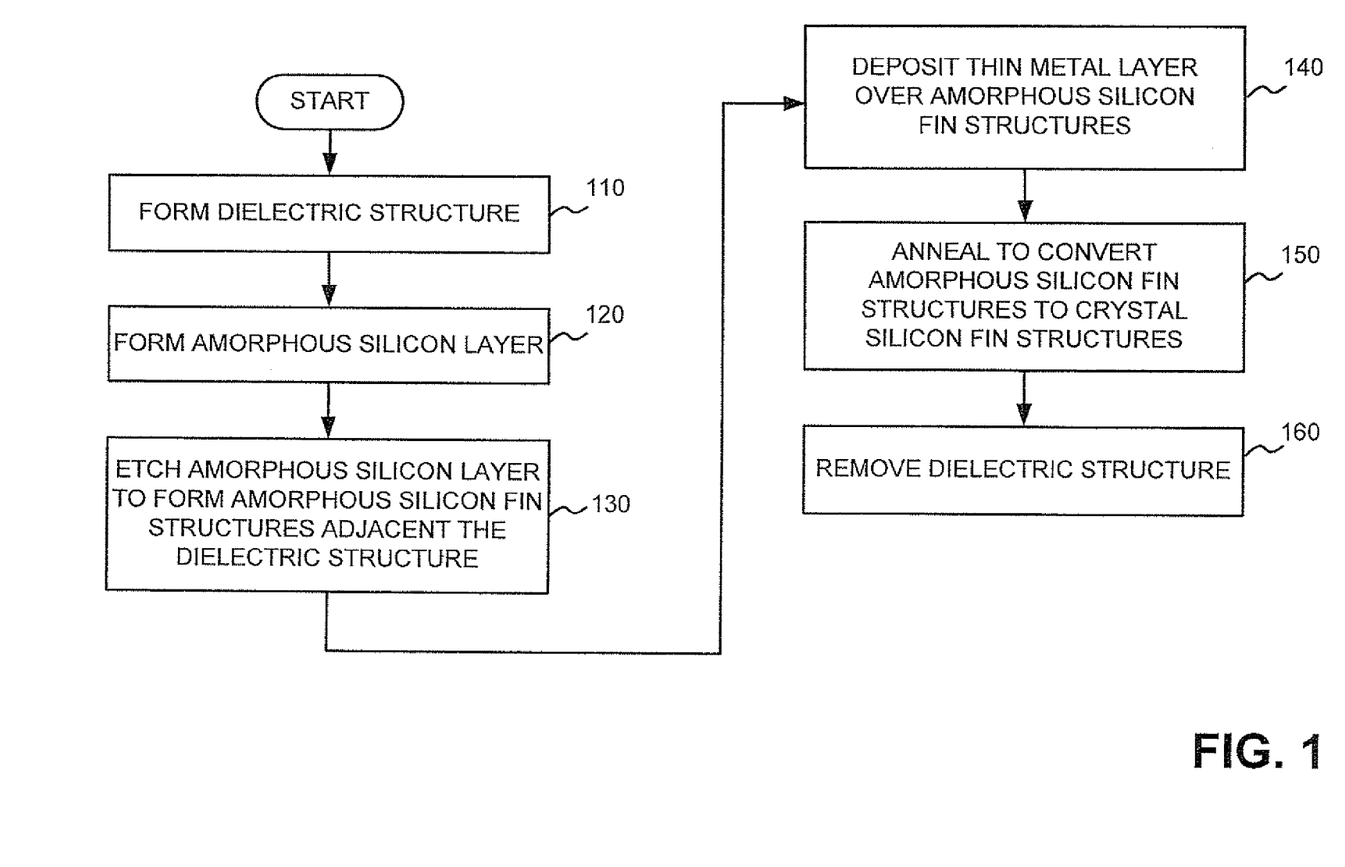
FIG. 1 illustrates an exemplary process for forming fin structures for a FinFET device in an implementation consistent with the principles of the invention.

FIG. 1 illustrates an exemplary process for forming fin structures for a FinFET device in accordance with an implementation consistent with the principles of the invention. FIGS. 2-8 illustrate exemplary views of a FinFET device fabricated according to the processing described with respect to FIG. 1. The fabrication of one FinFET device will be described hereinafter. It will be appreciated, however, that the techniques described herein are equally applicable to forming more than one FinFET device.

Figure 2:
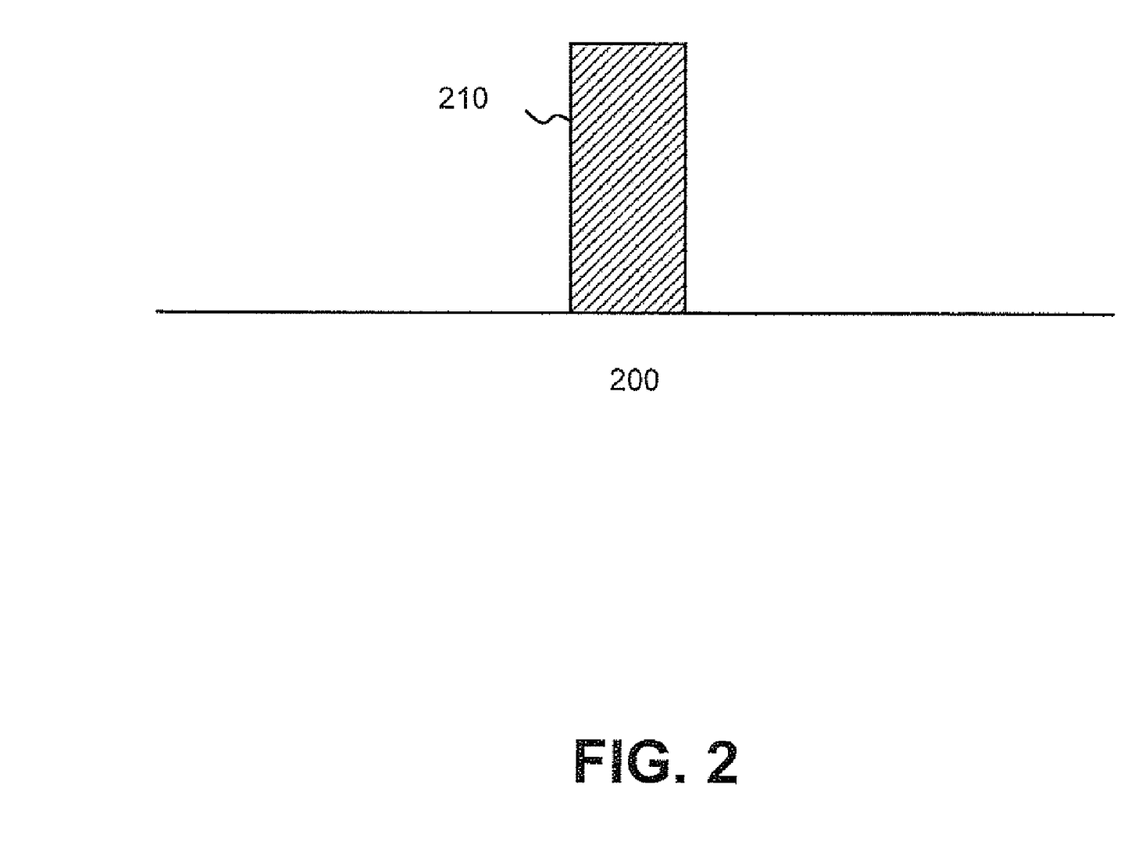
FIGS. 2-8 illustrate exemplary views of a FinFET device fabricated according to the processing described in FIG. 1.

With reference to FIGS. 1 and 2, processing may begin by forming a dielectric structure 210 on a substrate 200 of a semiconductor device (act 110). In one implementation, substrate 200 may include silicon. In alternative implementations consistent with the present invention, substrate 200 may include other semiconducting materials, such as germanium, or combinations of semiconducting materials, such as silicon-germanium. In another alternative, substrate 200 may include an insulator, such as an oxide layer, formed on a silicon or germanium layer. Dielectric structure 210 may include a dielectric material, such as an oxide or a nitride.

Dielectric structure 210 may be formed in a conventional manner. For example, a dielectric material, such as an oxide material (e.g., $SiO_2$) may be deposited over substrate 200 to a thickness ranging from about 500 Å to about 2000 Å. A mask may be formed over a portion of the dielectric material and the dielectric material may then be etched in a conventional manner, with the etching terminating on substrate 200 to form dielectric structure 210. Further thinning of dielectric structure 210 may be achieved by an additional conventional etching process. The resulting dielectric structure 210 may have a width ranging from about 200 Å to about 1000 Å.

Figure 3:
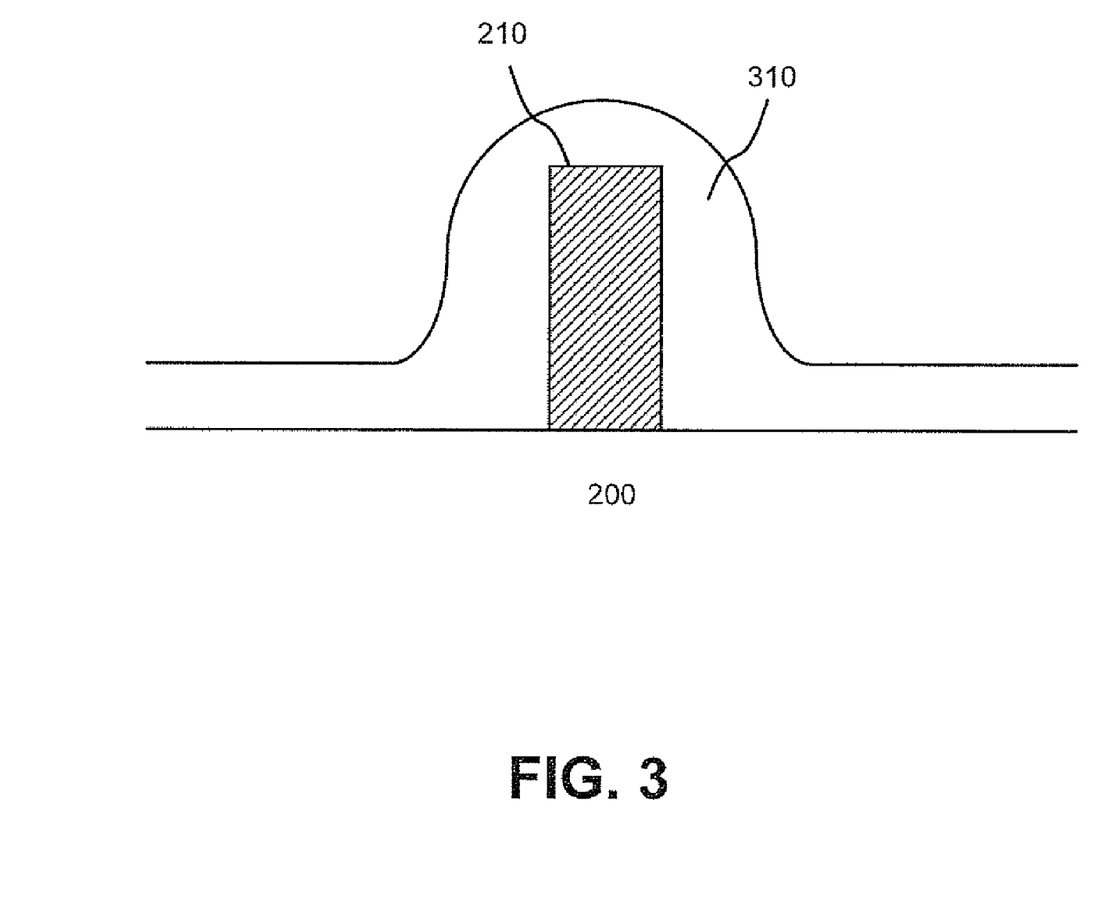

After forming dielectric structure 210, an amorphous silicon layer 310 may be deposited on the semiconductor device, as illustrated in FIG. 3 (act 120). In one implementation consistent with the principles of the invention, amorphous silicon layer 310 may be deposited to a thickness ranging from about 100 Å to about 1000 Å.

Figure 4:
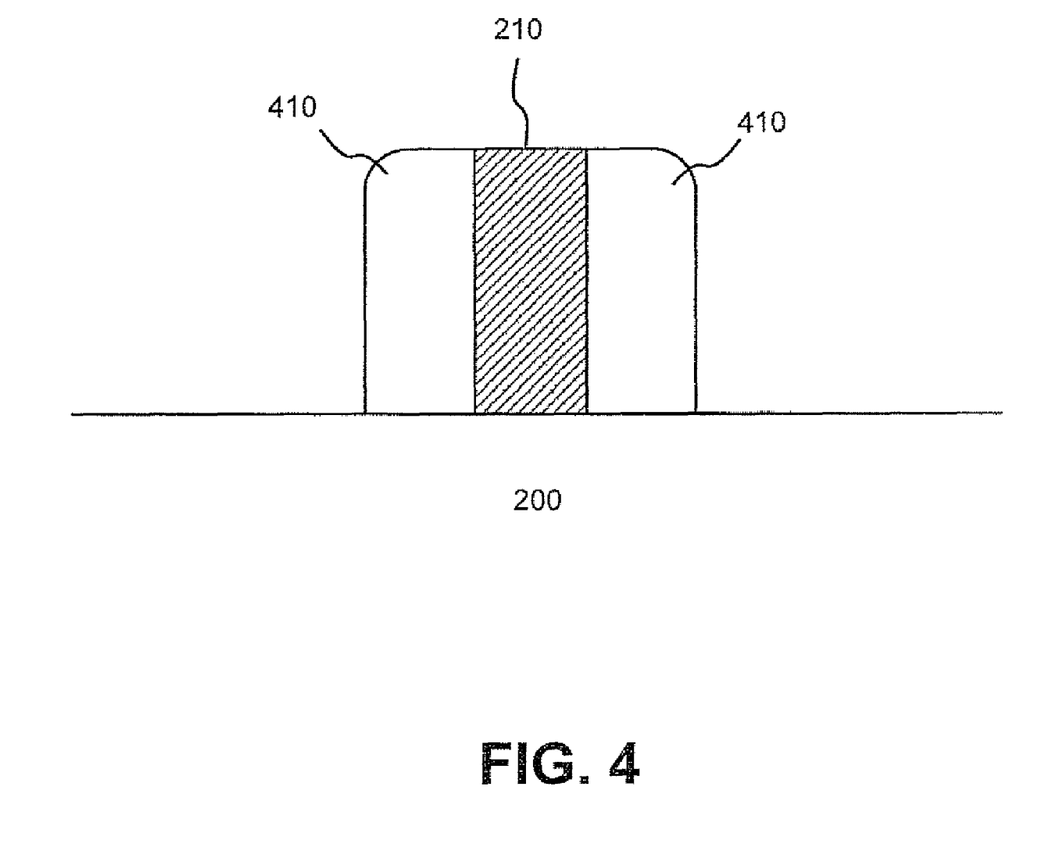

Amorphous silicon layer 310 may then be etched in a conventional manner, with the etching terminating at substrate 200 to form amorphous silicon fin structures 410, as illustrated in FIG. 4 (act 130). Each amorphous silicon fin structure 410 may have a height ranging from about 500 Å to about 2000 Å and a width ranging from about 100 Å to about 1000 Å.

Figure 5:
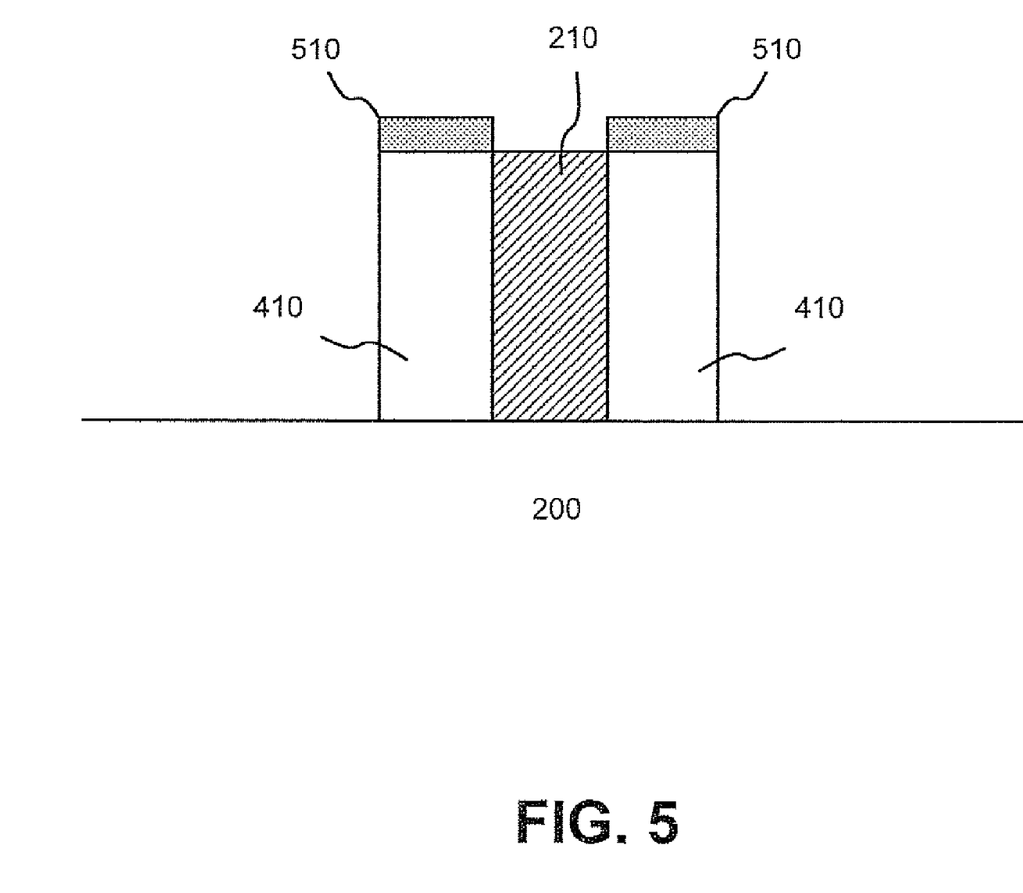

A thin metal layer 510, such as nickel, may be deposited on the semiconductor device, as illustrated in FIG. 5 (act 140). For example, a mask may be used to facilitate the deposition of nickel layer 510 over amorphous silicon fin structures 410, as illustrated in FIG. 5. In one implementation, nickel layer 510 may be deposited to a thickness of about 20 Å.

Figure 6:
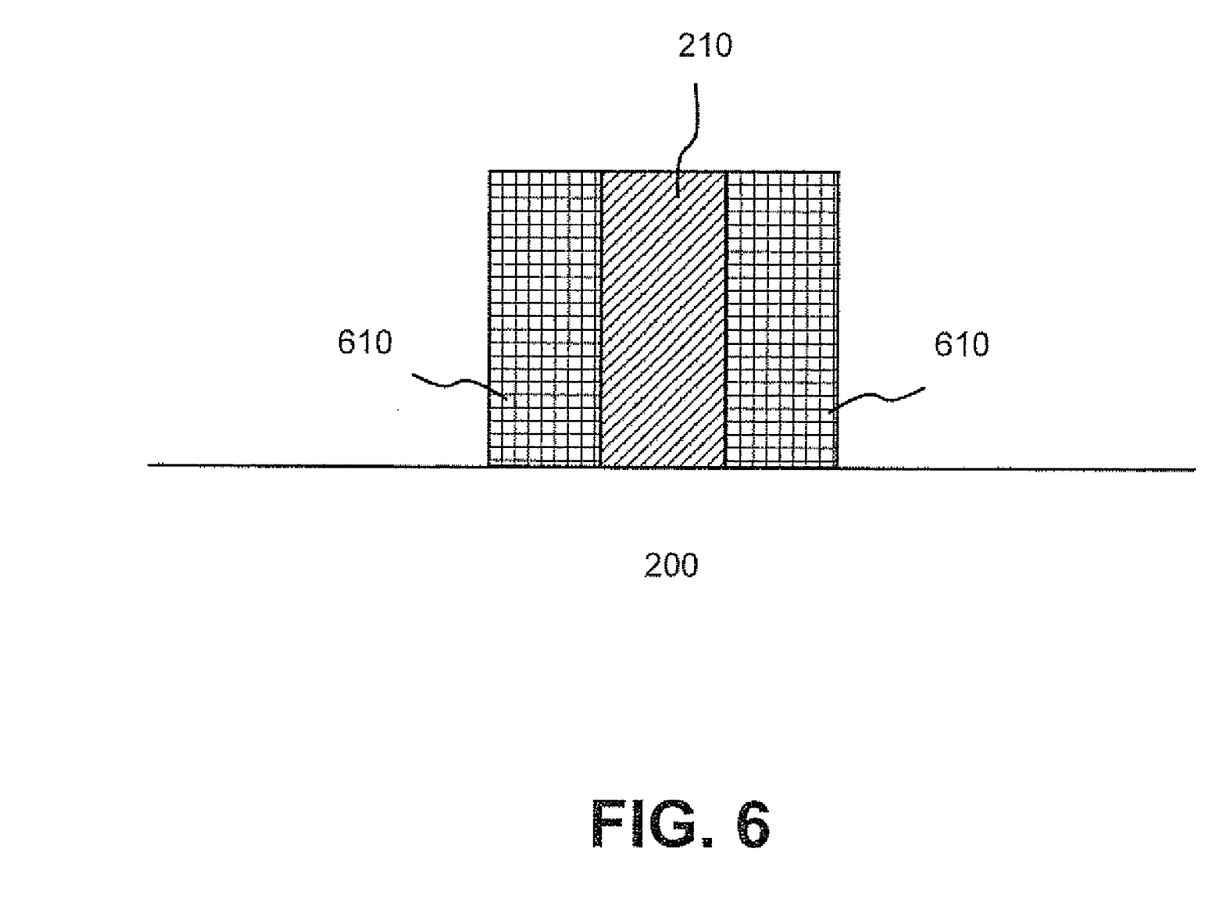

A metal-induced-crystallization (MIC) operation may then be performed. The MIC operation may involve annealing nickel layer 510 at about 500° C. to about 550° C. for several hours, which acts to diffuse the nickel into the amorphous silicon to convert the amorphous silicon in fin structures 410 to crystalline silicon fin structures 610, as illustrated in FIG. 6 (act 150).

Figure 7:
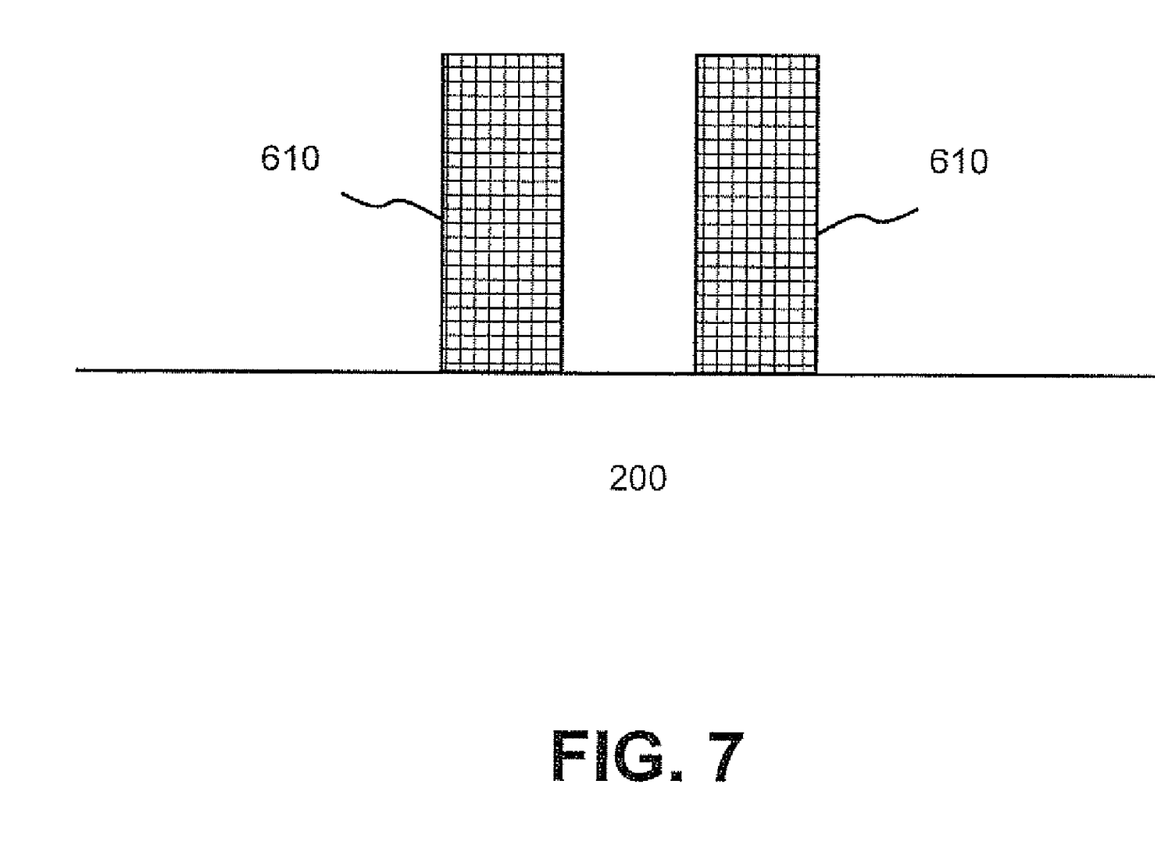

After crystalline silicon fin structures 610 are formed, dielectric structure 210 may be removed, as illustrated in FIG. 7 (act 160). For example, a conventional etching technique selective to the material in dielectric structure 210 may be used to remove dielectric structure 210, while minimizing effects to crystalline silicon fin structures 610. Alternatively, a mask may be formed over fin structures 610 to protect fin structures 610 during the etching. The etching of dielectric structure 210 may terminate on substrate 200, as illustrated in FIG. 7.

The resulting fin structures 610, consistent with the present invention, may have a small pitch (i.e., center-to-center distance between fin structures 610). For example, the pitch for fin structures 610 may be as small as about 300 Å.

Once dielectric structure 210 is removed, conventional FinFET fabrication processing can be used to complete the transistor (e.g., forming the source and drain regions, contacts, interconnects and inter-level dielectrics for the FinFET device). For example, a protective dielectric layer, such as a silicon nitride or silicon oxide may be formed on the top surface of fin structures 610, followed by the formation of a gate dielectric on the side surfaces of fin structures 610. Source/drain regions may then be formed at the respective ends of fin structures 610, followed by formation of one or more gates. For example, a silicon layer, germanium layer, combinations of silicon and germanium or various metals may be used as the gate material. The gate material may then be patterned and etched to form the gate electrodes.

Figure 8:
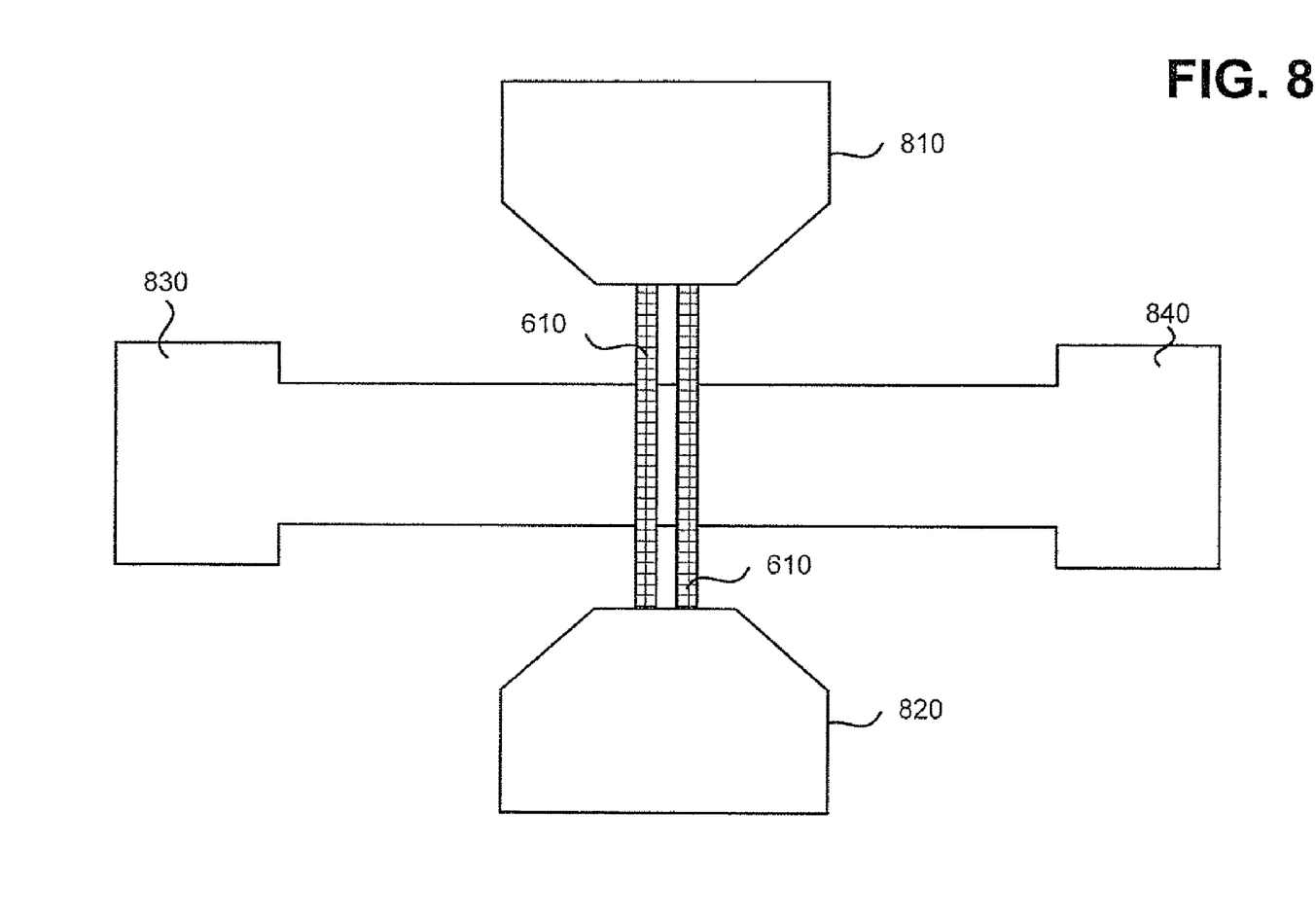

For example, FIG. 8 illustrates an exemplary top view of the semiconductor device consistent with the principles of the invention after the source/drain regions and gate electrodes are formed. As illustrated, the semiconductor device includes a double-gate structure with fin structures 610, source and drain regions 810 and 820, and gate electrodes 830 and 840.

Source/drain regions 810 and 820 may then be doped with n-type or p-type impurities based on the particular end device requirements. In addition, sidewall spacers may optionally be formed prior to the source/drain ion implantation to control the location of the source/drain junctions based on the particular circuit requirements. Activation annealing may then be performed to activate source/drain regions 810 and 820.

A FInFET device, as described above, is formed with two crystalline silicon fin structures. It should be understood that methods consistent with the present invention may be used to form any number of fin structures, such as more than two fin structures, based on the particular circuit requirements. In this case, additional dielectric structures may also be formed.

Other Implementations

Figure 9:
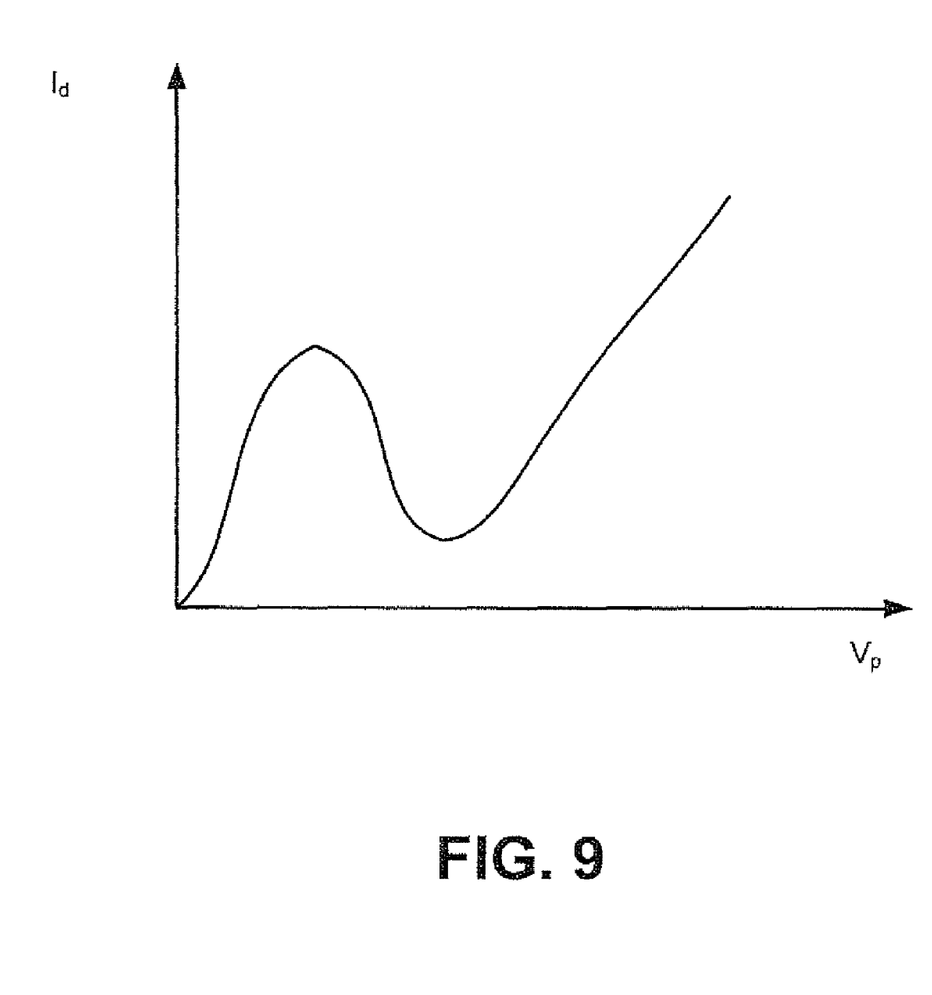
FIG. 9 is an exemplary graph illustrating negative resistance behavior.

Heavily doped channel FinFETs exhibit behavior similar to that exhibited by negative resistance devices. The negative resistance device behavior may be used to form a static random access memory (SRAM). FIG. 9 is an exemplary graph illustrating this negative resistance behavior.

Figure 10:
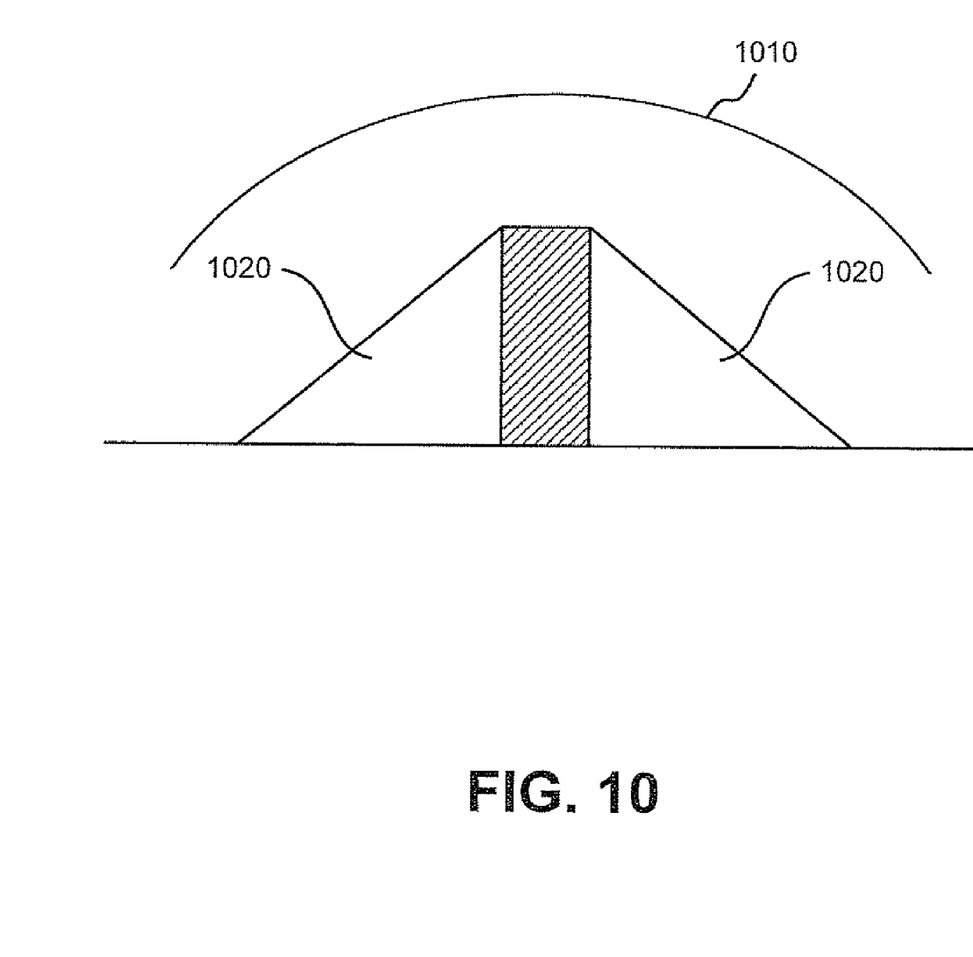
FIG. 10 is a diagram of exemplary triangular spacers.

It is sometimes desirable to create a triangular spacer for a FinFET device because it facilitates polysilicon patterning for the FinFET device. FIG. 10 is a diagram of exemplary triangular spacers. For example, a polysilicon layer 1010 may be deposited over a semiconductor device. Polysilicon layer 1010 may then be etched to form triangular spacers 1020. Certain deposition and etching techniques are known to those skilled in the art to create smooth triangular spacers 1020, as illustrated in FIG. 10, as opposed to step spacers (e.g., the spacers created as shown in FIGS. 3 and 4).

CONCLUSION

Implementations consistent with the principles of the invention provide multiple crystalline silicon fin structures for a FinFET device. The multiple fin structures may be densely provided so as to have a very small pitch.

The foregoing description of exemplary embodiments of the present invention provides illustration and description, but is not intended to be exhaustive or to limit the invention to the precise form disclosed. Modifications and variations are possible in light of the above teachings or may be acquired from practice of the invention.

For example, in the above descriptions, numerous specific details are set forth, such as specific materials, structures, chemicals, processes, etc., in order to provide a thorough understanding of the present invention. However, the present invention can be practiced without resorting to the details specifically set forth herein. In other instances, well known processing structures have not been described in detail, in order not to unnecessarily obscure the thrust of the present invention. In practicing the present invention, conventional deposition, photolithographic and etching techniques may be employed, and hence, the details of such techniques have not been set forth herein in detail.

While a series of acts has been described with regard to FIG. 1, the order of the acts may be varied in other implementations consistent with the present invention. Moreover, non-dependent acts may be implemented in parallel.

No element, act, or instruction used in the description of the present application should be construed as critical or essential to the invention unless explicitly described as such. Also, as used herein, the article "a" is intended to include one or more items. Where only one item is intended, the term "one" or similar language is used. The scope of the invention is defined by the claims and their equivalents.

What is claimed is:

1. A method of forming fin structures for a semiconductor device that includes a substrate and a dielectric layer formed on the substrate, the method comprising:
    etching the dielectric layer to form a first structure;
    depositing an amorphous silicon layer over the first structure;
    etching the amorphous silicon layer to form second and third fin structures adjacent first and second side surfaces of the first structure, the second and third fin structures including amorphous silicon material;
    depositing, using a mask, a metal layer on upper surfaces of the second and third fin structures and not on the first structure;
    performing a metal-induced crystallization operation to convert the amorphous silicon material of the second and third fin structures to a crystalline silicon material; and
    removing the first structure.

2. The method of claim 1, wherein a width of the first structure ranges from about 200 Å to about 1000 Å.

3. The method of claim 1, wherein the dielectric layer comprises at least one of an oxide and a nitride.

4. The method of claim 1, wherein a width of each of the second and third fin structures ranges from about 100 Å to about 1000 Å.

5. The method of claim 1, wherein the etching the dielectric layer includes:
    thinning the first structure using an additional etching process.

6. The method of claim 1, wherein the depositing a metal layer includes:
    depositing a nickel layer to a thickness of about 20 Å.

7. The method of claim 1, wherein the etching the amorphous silicon layer includes:
    etching the amorphous silicon layer to form a plurality of fin structures, wherein the plurality of fin structures includes more than two fin structures.

8. The method of claim 1, wherein the performing a metal-induced crystallization operation includes:
    annealing the semiconductor device at a temperature of about 500° C. to about 550° C.

9. The method of claim 8, wherein the annealing is performed for at least two hours.

10. A method of forming fin structures for a semiconductor device, comprising:
    forming a plurality of fin structures from amorphous silicon;
    depositing, using a mask, a metal layer on a surface of each of the plurality of fin structures and not on dielectric structures separating the plurality of fin structures; and
    annealing the metal layer to convert the amorphous silicon to crystalline silicon to produce a plurality of crystalline fin structures.

11. The method of claim 10, wherein forming the plurality of fin structures comprises:
    forming a layer of amorphous silicon; and
    etching the layer of amorphous silicon to form each of the plurality of fin structures to a height ranging from about 500 Å to about 2000 Å and to a width ranging from about 100 Å to about 1000 Å.

12. The method of claim 10, wherein the metal layer comprises nickel.

13. The method of claim 10, wherein depositing the metal layer comprises:
    depositing the metal layer to a thickness of approximately 20 Å on the surface of each of the plurality of fin structures.

14. The method of claim 10, wherein annealing the metal layer comprises:
    annealing the metal layer at a temperature of about 500° C. to about 550° C. for several hours.

15. The method of claim 10, further comprising:
    forming a source region at one end of the plurality of fin structures;
    forming a drain region at an opposite end of the plurality of fin structures; and
    forming at least one gate.

16. A method, comprising:
    forming a fin structure from amorphous semiconducting material;
    forming a mask to facilitate deposition of a metal layer on a surface of the fin structure and not on a dielectric structure formed adjacent the fin structure;
    forming the metal layer on the surface of the fin structure; and
    performing a metal-induced-crystallization operation upon the fin structure to convert the amorphous semiconducting material to crystalline semiconducting material.

17. The method of claim 16, wherein the semiconducting material comprises silicon.

18. The method of claim 16, wherein performing a metal-induced-crystallization operation comprises:
    annealing the metal layer to convert the amorphous silicon to crystalline silicon to produce a crystalline fin structure.

19. The method of claim 18, wherein annealing the metal layer comprises:
    annealing the metal layer at about 500° C. to about 550° C. for several hours.

20. The method of claim 18, wherein the metal layer comprises nickel and wherein forming the metal layer comprises:
    depositing the metal layer to a thickness of approximately 20 Å on the surface of the fin structure.

* * * * *